US012754266B2

(12) United States Patent
Nielsen et al.

(10) Patent No.: US 12,754,266 B2
(45) Date of Patent: Oct. 6, 2026

(54) MAGNETIC RESONANCE IMAGING WITH MACHINE-LEARNING BASED SHIM SETTINGS

(71) Applicant: KONINKLIJKE PHILIPS N.V., Eindhoven (NL)

(72) Inventors: Tim Nielsen, Hamburg (DE); Jan Hendrik Wuelbern, Hamburg (DE); Oliver Lips, Hamburg (DE); Peter Ulrich Boernert, Hamburg (DE); Kay Nehrke, Ammersbek (DE); Sharun S Thazhzackal, Bangalore (IN); Suja Saraswathy, Bangalore (IN); Manivannan Japapalan, Bangalore (IN); Ashvin Srinivasan, Bangalore (IN); Umesh Suryanarayana Rudrapatna, Bangalore (IN); Jaladhar Neelavalli, Karnataka (IN)

(73) Assignee: Koninklijke Philips N.V., Eindhoven (NL)

( * ) Notice: Subject to any disclaimer, the term of this patent is extended or adjusted under 35 U.S.C. 154(b) by 130 days.

(21) Appl. No.: 18/702,366

(22) PCT Filed: Oct. 19, 2022

(86) PCT No.: PCT/EP2022/079006

§ 371 (c)(1),
(2) Date: Apr. 18, 2024

(87) PCT Pub. No.: WO2023/066950

PCT Pub. Date: Apr. 27, 2023

(65) Prior Publication Data

US 2025/0251475 A1 Aug. 7, 2025

(30) Foreign Application Priority Data

Oct. 22, 2021 (EP) .................................... 21204137

(51) Int. Cl.

*G01V 3/00* (2006.01)
*G01R 33/3875* (2006.01)

(Continued)

(52) U.S. Cl.

CPC ..... *G01R 33/3875* (2013.01); *G01R 33/5608* (2013.01); *G01R 33/56563* (2013.01); *G01R 33/5659* (2013.01)

(58) Field of Classification Search

CPC ............ G01R 33/3875; G01R 33/5608; G01R 33/56563; G01R 33/5659

(Continued)

(56) References Cited

U.S. PATENT DOCUMENTS 8,194,921 B2 * 6/2012 Kongqiao .............. G06F 3/017 382/103
2001/0053877 A1 12/2001 Brand et al.

(Continued)

FOREIGN PATENT DOCUMENTS

DE 102015225080 A1 * 6/2017 ........... G01R 33/443
JP 2016097162 A 5/2016
JP 2020124275 A 8/2020

OTHER PUBLICATIONS

Julianna D. Ianni et al: "Machine learning RF shimming: Prediction by iteratively projected ridge regression", Magnetic Resonance in Medicine, vol. 80, No. 5, Mar. 23, 2018 (Mar. 23, 2018) , pp. 1871-1881.

(Continued)

*Primary Examiner* — Walter L Lindsay, Jr.
*Assistant Examiner* — Frederick Wenderoth

(57) ABSTRACT

A magnetic resonance examination system comprising a main magnet for applying a uniform static magnetic field. An active shim system applies shim magnetic fields to correct for inhomogeneities of the static magnetic field. A shim driver system activates the active shim system on the basis of $B_0$-shim settings. A trained machine-learning module is trained to return the $B_0$-shim settings from one or more actual load parameters. The magnetic resonance examination system may further comprise an RF transmit system (Continued)

with RF antenna elements and an RF driver system to activate the RF antenna elements for applying a ($B_1$) radio frequency field having a predetermined spatial distribution. An RF shim system to control the RF driver system to apply shim radio frequency fields to correct for deviation of the radio frequency field's spatial distribution from the predetermined spatial distribution on the basis of RF-shim settings. A trained machine-learning module trained to return the RF-shim settings from one or more actual load parameters.

18 Claims, 6 Drawing Sheets

(51) Int. Cl.
*G01R 33/56* (2006.01)
*G01R 33/565* (2006.01)
(58) Field of Classification Search
USPC .......................................................... 324/309
See application file for complete search history.

(56) References Cited

U.S. PATENT DOCUMENTS

| | | | | |
|---|---|---|---|---|
| 2008/0088306 | A1 | 4/2008 | Dewdney et al. | |
| 2011/0260727 | A1* | 10/2011 | Punchard | G01R 33/3875 324/318 |
| 2014/0239950 | A1 | 8/2014 | Ookawa | |
| 2017/0308734 | A1* | 10/2017 | Chalom | G06V 40/193 |
| 2018/0246179 | A1* | 8/2018 | Zhai | G01R 33/3875 |
| 2020/0085382 | A1* | 3/2020 | Taerum | A61B 6/563 |
| 2020/0256936 | A1* | 8/2020 | Liu | G01R 33/583 |
| 2024/0077565 | A1 | 3/2024 | Neelavalli et al. | |

OTHER PUBLICATIONS

Raphael Tomi-Tricot et al: "SmartPulse, a machine learning approach for calibration-free dynamic RF shimming: Preliminary study in a clinical environment" Magnetic Resonance in Medicine, vol. 82, No. 6, Jun. 30, 2019 (Jun. 30, 2019), pp. 2016-2031.
International Search Report and Written Opinion from PCT/EP2022/079006 mailed Apr. 3, 2023.
Koch KM, Papademetris X, Rothman DL, De Graaf RA. "Rapid calculations of susceptibility-induced magnetostatic field perturbations for in vivo magnetic resonance," Phys Med Biol 2006;51:6381-6402.
Benner et al "Real-Time RF Pulse Adjustment for Bo Drift Correction" Magnetic Resonance in Med. 56 p. 204-209 (2006).
Stockmann JP, Wald LL. In vivo B0 field shimming methods for MRI at 7T. Neuroimage. Mar. 2018;168:71-87. doi: 10.1016/j.neuroimage.2017.06.013. Epub Jun. 7, 2017. PMID: 28602943; PMCID: PMC5760477.
Vidya Prasad et.al, "On the predictability of MRI B0 maps at Ultra-high fields using Deep learning" Proc. Intl. Soc. Mag. Reson. May 20, 2021.
Kamlesh Pawar et.al "Estimating Uncertainty in Deep Learning MRI Reconstruction using a Pixel Classification Image Reconstruction Framework". , Proc. Intl. Soc. Mag. Reson. Med 29, 0276.
Gal, Yarin & Ghahramani, Zoubin. (2015). Dropout as a Bayesian Approximation: Representing Model Uncertainty in Deep Learning. Proceedings of The 33rd International Conference on Machine Learning.
Killock, David. (2020). AI outperforms radiologists in mammographic screening. Nature Reviews Clinical Oncology. 17. 10.1038/s41571-020-0329-7 2020.
Nguyen, Anh & Yosinski, Jason & Clune, Jeff. (2014). Deep Neural Networks Are Easily Fooled: High Confidence Predictions for Unrecognizable Images. IEEE Conference on Computer Vision and Pattern Recognition (CVPR) 2015.
L. R. Chai, "Uncertainty estimation in bayesian neural networks and links to interpretability," Master's thesis, University of Cambridge, Aug. 2018.
"Bayes by backprop from scratch (nn, classification)," https://gluon.mxnet.io/chapter18 variational-methods-and-uncertainty/bayes-by-backprop.html, 2017.
Rassadin, Alexandr. (2020). Deep Residual 3D U-Net for Joint Segmentation and Texture Classification of Nodules in Lung. 10.1007/978-3-030-50516-5_37 Jun. 25, 2020.

* cited by examiner

MAGNETIC RESONANCE IMAGING WITH MACHINE-LEARNING BASED SHIM SETTINGS

CROSS REFERENCE TO RELATED APPLICATIONS

This application is a U.S. national phase application of International Application No. PCT/EP2022/079006 filed on Oct. 19, 2022, which claims the benefit of EP Application Serial No. 21204137.0 filed on Oct. 22, 2021 and is incorporated herein by reference.

FIELD OF THE INVENTION

The invention pertains to a magnetic resonance examination system comprising a main magnet for applying a uniform static magnetic field ($B_0$) and an active shim system to apply shim magnetic fields to correct for inhomogeneities of the static magnetic field. A shim driver system is provided to activate the active shim system on the basis of $B_0$-shim settings. The magnetic resonance examination system further comprises a radio frequency (RF) transmit system configured to emit an RF $B_1^+$-field with a predetermined spatial distribution into the magnetic resonance examination system's examination zone.

BACKGROUND OF THE INVENTION

Such a magnetic resonance examination system is known from the paper "Template-Based Field Map Prediction for Rapid Whole Brain $B_0$ Shimming", In Magnetic Resonance in Medicine 80 (2018) 171-180 by Y. Shi et. al.

This publication concerns a template-based method to determine the $B_0$-inhomogeneities caused by the presence of a human head in the $B_0$-field. Shim settings are derived from the $B_0$-field distribution that is determined by the template-based method.

The US-patent application US2001/053877 discloses a magnetic resonance apparatus with an active shim system for improving the basic (main) magnetic field homogeneity within the magnetic resonance apparatus' imaging volume. The shim currents to derive the active shim system and offset currents for the gradient system can be adjusted by the neural network.

SUMMARY OF THE INVENTION

An object of the invention is to provide a magnetic resonance examination system for which preparation time for magnetic resonance imaging is reduced. Notably, an aim of the invention is to reduce the time required for determining accurate $B_0$-shim settings.

This object is achieved by an magnetic resonance examination system of the invention comprising

- a main magnet for applying a uniform static magnetic field,
- an active shim system to apply shim magnetic fields to correct for inhomogeneities of the static magnetic field,
- a shim driver system to activate the active shim system on the basis of $B_0$-shim settings and
- a trained machine-learning module trained to return the $B_0$-shim settings from one or more actual load parameters.

The active shim system includes one or more shim coils to generate shim magnetic fields that are superposed on the uniform static magnetic field from the main magnet so that any main field inhomogeneities ($B_0$-inhomogeneities) are compensated for the by magnetic shim fields. Notably, $B_0$-inhomogeneities are compensated for within (a part of) the examination zone. The $B_0$-shim settings may represent the electrical current strengths to be applied to the respective shim coils for generating the compensation shim magnetic fields. The shim driver system may be implemented as an electrical current or voltage amplifier to apply electrical power to the shim coils of the shim system. The shim system may in practice be combined with or integrated with a gradient system that operates to generate gradient magnetic field pulses for spatial encoding of magnetic resonance signals. An insight of the present invention is that the $B_0$-shim settings can be accurately determined on the basis of machine-learning (ML) from the actual load parameters for the actually intended examination. The load parameters represent the electromagnetic loading or coupling of the patient's body with the radio frequency (RF) transmit and receive antenna (coils or coil array) system of the magnetic resonance examination system. Accordingly, the present invention achieves that for the determination of the $B_0$-shim settings, there is no need to acquire any MR data at all, or only a small set of relatively simple MR data is needed, from the magnetic resonance examination system when the object to be imaged, e.g. a patient to be examined, is positioned in the magnetic resonance examination system's examination zone. The actual load parameters may represent features of the body of the patient to be examined. For example, the actual load parameters for example relate to patient weight, patient orientation, patient position in the reference frame of the magnet. Other options for the actual load parameters are an actual position in the reference frame of the magnet of a patient carrier, a body part to be examined, or patient gender. Information from which the actual load parameters may be determined may be obtained from images of the examination zone with the patient to be examined in position acquired by a (e.g. in-bore camera). The camera may be an optical (e.g. RGB-colour) camera or an infrared (IR) camera. The IR-camera does not require (high-level) illumination of the examination zone but may rely on temperature distribution of the body temperature of the patient to be examined and temperature of the patient carrier. This further avoids the need for strong illumination that may be uncomfortable for the patient to be examined. From these images parameters (position, orientation, . . . ) and possibly more parameters (e.g. coarse shape of the body, . . . ) can be determined and added to the model. These images may be generated by an optical of thermal (near IR) camera configured to acquire images from the magnetic resonance examination system's examination zone. Alternatively, actual load parameters may be derived from image information incorporated in a low-resolution survey image. Further, technical information on actually connected radio frequency (RF) coils may be included in the actual load parameters to account for the electromagnetically responses of the RF coil when loaded with the patient's body (e.g. coil geometry properties that affect the Q-factor due to electromagnetic loading).

The present invention avoids the need for a time consuming and error prone shim preparation phase to be carried-out directly supervised by a human operator. In this way the MR examination as a whole is accelerated. From the US-patent application US2020/0072931 it is known per se to make use of a neural network to derive an estimation of start parameters for a multi-parameter non-linear regression $\Delta B_0$-mapping method which maps the magnetic field inhomogeneities.

These and other aspects of the invention will be further elaborated with reference to the embodiments defined in the dependent Claims.

In an embodiment of the invention, the magnetic resonance examination system is provided with a $B_0$-mapping system to generate a spatial field distribution of the uniform static magnetic field from measurements that represent the local magnetic field strength, i.e. make $B_0$-field measurements. The $B_0$-mapping system is further configured to compute $B_0$-shim settings from the $B_0$-field measurements. Further, the $B_0$-mapping system is configured to compare the computed $B_0$-shim settings from the $B_0$-field measurements with the $B_0$-shim settings obtained by machine-learning. This comparison may be represented in a confidence map representing deviations between the computed $B_0$-shim settings and the $B_0$-shim settings form the machine learning. The smaller the deviation between the measured shim settings and the shim settings obtained by the machine learning, the higher the confidence in the shim settings returned by the machine learning. Small deviations represent a high consistency between measured and machine learnt results. This confidence map may be presented to the operator on a graphical user interface. To this end, the user-interface is configured to derive a confidence map from the comparison of the computed $B_0$-shim settings and the shim settings from the trained machine-learning module and display the confidence map.

In another embodiment of the invention, the machine-learning module is also trained to return $B_0$-shim settings in response to a low-resolution magnetic resonance image, such as a survey image, and the shim driver system is configured to generate compound $B_0$-shim settings from (i) the $B_0$-shim settings from the actual load parameter(s) and (ii) the $B_0$-shim settings (or main field inhomogeneity data) from the low-resolution magnetic resonance image. In this way the $B_0$-shim settings are more accurately adjusted to the actual load configuration, at the cost of only a simple acquisition of MR-data from only a centre region of k-space that only requires a short acquisition time, for example of only of the order of a few seconds, for acquisition of a small MR image data set.

In an embodiment of the magnetic resonance examination system of the invention, a $B_0$-mapping system is provided to generate a spatial distribution of the actual main magnetic field inhomogeneities ($B_0$-map). This $B_0$-map may be computed from a survey image or image data acquired for calibration of receiver radio frequency (RF) sensitivity profiles. In the event a multi-point Dixon water-fat separation method is applied, that also makes available data for the $B_0$-map. A comparator is provided (e.g. in software) to compare shim values derive from the acquired $B_0$-map with the values of the $B_0$-shim settings returned by the trained machine-learning from the actual load parameters. This comparison may be employed to update the settings of the machine-learning, such as weights of a neural network to improve the accuracy of the prediction by the machine learning module of the $B_0$-shim settings from the actual load parameters.

In a further embodiment of the magnetic resonance examination system of the invention, a user interface is provided and configured to derive a confidence map from the computed $B_0$-settings and the $B_0$-shim settings returned by the machine learning module. The confidence map may be displayed on the user interface's display. This may support the operator on how to rely on the $B_0$-shim settings returned by the machine-learning module and whether to dispense with conventional computation of $B_0$-shim settings based on the $B_0$-map. On the basis of the confidence map, the user may override the machine-learning module and trigger a manual measurement of the $B_0$-map. In a further version the magnetic resonance examination system's shim driver system may be configured to autonomously acquire $B_0$-mapping data in the event of idle times during an examination protocol.

In a further embodiment of the magnetic resonance examination system of the invention, the machine-learning module is trained to return $B_0$-shim settings in response to a low-resolution magnetic resonance image as well as in response to the actual load parameters. Compound $B_0$-shim settings may be computed by the shim driver system that are more accurate than the $B_0$-shim settings returned from the actual load parameters. This increased accuracy of the compound $B_0$-shim settings may in turn be employed to further train the machine-learning module to return more accurate $B_0$-shim settings from the actual load parameters. As the machine-learning module is increasingly better trained with use, the machine-learning module behaviour may evolve to making less-and-less use of $B_0$-mapping data from MR image data (e.g. from the survey scan). This leads to increasing time efficiency of the preparation phase prior to actual acquisition of diagnostic MR image data of high spatial resolution and intended contrast weighting.

The invention further pertains to training the machine-learning module to return $B_0$-shim settings from the actual load parameters. In particular, the training may be done in a continuous manner on the basis of log-file information either of the magnetic resonance examination system itself or even log-file data from an installed base of multiple magnetic resonance examination systems. Very good results are achieved by a machine learning model that involves a random forest regression. Also machine-learning models based on neural networks lead to a well-trained machine learning model. Good results are achieved by fully connected (i.e. non-deep and non-convolutional) networks. Other network architectures are assumed to work as well. Notably, the log-file data contain information on the values of the actual load parameters and the optimised shim settings in, typically, a large number of imaging procedure s carried-out by the magnetic resonance examination system or magnetic resonance examination system of very similar type.

In an implementation of the training of the machine-learning model, the training may be done on the basis of log-file data and $B_0$-shim settings computed from (e.g. low-resolution) acquired MR image data. As to the machine-learning model is further trained and achieves a higher level of accuracy and reliability, conventionally computed $B_0$-shim values from acquired MR data may be more-and-more dispensed with. The level of accuracy and reliability may be assessed on the basis of a statistical analysis of the comparison between machine-learning derived $B_0$-shim settings and the shim settings computed from MR image data (e.g. based on log file data). Such statistical analysis maybe done on the basis of correlation between the predicted and the measured values, comparison by means of different error measures, like means square errors, difference in $L_1$-norm, etc.

Another aspect of the invention pertains to a magnetic resonance examination system comprising a radio frequency system to transmit a radio frequency field ($B_1^+$) into the examination zone. For the radio frequency field to be transmitted a predetermined spatial distribution is prescribed. The radio frequency field's spatial distribution may be controlled on the basis of the frequency settings of the radio frequency system in combination with gradient magnetic field pulses that are superposed on the uniform static magnetic field during the transmission of the radio frequency field. The radio frequency field transmitted into the examination zone may manipulate nuclear spins in the object to be examined (e.g. the patient to be examined), such as spin flips, spin inversion, spin refocusing etc.).

Another insight of the present invention is that the $B_1$-shim settings can be accurately determined on the basis of machine-learning from the actual load parameters for the actually intended examination. These $B_1$-shim settings pertain to corrections for the radio frequency (RF) $B_1^+$-excitation field. These corrections represent deviations of the spatial distribution of the actually transmitted $B_1^+$-RF field to a set predetermined reference distribution. This predetermined reference distribution may be a spatially uniform distribution e.g. as produced by an ideal quadrature body coil (QBC) or a specially designed spatial RF profile, such as a pencil beam excitation or excitation of a predefined spatial slab. Accordingly, the present invention achieves that for the determination of the $B_1$-shim settings, there is no need to acquire any MR data at all, or only a small set of relatively simple MR data are needed, from the magnetic resonance examination system when the object to be imaged, e.g. a patient to be examined, is positioned in the magnetic resonance examination system's examination zone. Further, the machine-learning based determination of the $B_1$-shim settings may be combined with the machine-learning based determination of the $B_0$-shim settings. Hence, time consuming $B_1$-shim settings as well as $B_0$-shim settings may be determined without the need for MR data acquisition, or at most acquisition of a limited MR survey image data set. This further reduces the time and operator effort for carrying-out preparation phases before actual MR diagnostic imaging data are acquired. Hence, workflow of MR examinations is made more efficient.

The invention also pertains to a magnetic resonance examination system including a radio frequency (RF) transmit system to apply a $B_1^+$-radio frequency field having a predetermined spatial distribution. For example, the RF transmit system may transmit spatial uniform $B_1^+$-field into the magnetic resonance examination system's examination zone. The predetermined spatial distribution may be non-uniform e.g. to generate a local RF excitation profile for a navigator (e.g. a pencil beam shape) or to achieve spatial encoding based n there excitation field's spatial shape. This uniform $B_1^+$-field is formed by be a superposition of spatial transmission profiles from respective RF antenna elements or modes of the RF transmit system. To that end an RF driver system is provided to activate the respective RF antenna elements on the basis of RF shim settings so that the multiple RF antenna elements cooperate to generate the $B_1$-field of predetermined spatial distribution by way of interfering superposed contributions. The RF driver with the RF antenna elements in the way functions as the RF shim system. That is, the RF shim system and the RF transmit system may be based on common hardware components. The RF shim system functions to correct for deviation of the radio frequency field' spatial distribution form the predetermined (e.g. uniform) spatial distribution. According to this aspect of the invention, the RF-shim settings are returned from the actual load parameters by a machine learning module.

In another example of the magnetic resonance examination system of the invention, the RF-shim system is configured to validate the returned shim settings. This validation may be done on the basis of an analysis of the $B_1^+$-RF field generated from the returned RF-shim settings in a preparatory MR-signal acquisition for a preparatory acquisition, such as for a survey acquisition for a low-resolution survey magnetic resonance image. The analysis may be related to an assessment of the $B_1^+$-RF field spatial inhomogeneity. In a more sophisticated approach, the $B_1^+$-RF field may be assessed by statistical techniques such as computation of the mean, standard deviation, median values of the amplitude and phase of the $B_1^+$-RF-field, or on the basis of a histogram analysis of the amplitude and phase of the $B_1^+$-RF-field. In a simpler version, the analysis may be done on the basis of signal levels in a small number of pre-determined landmark positions.

The invention also pertains to a method of training a machine-learning model to return RF-shim settings for the RF-driver system so as to correct deviations of the $B_1^+$-RF-field relative to a pre-determined spatial distribution, which for example may be a spatially uniform distribution, and the invention may also be applied to spatially non-linear distributions of the $B_1^+$-RF-field. The machine-learning may be based on a neural network that is trained on the basis of log-file information that links previous RF shim settings to previous load parameters.

In an implementation of the training method of the invention, the log-file information may be updated or enhanced on the basis of the validation of returned RF-shim settings. In this way the set of training data is enlarged that leads to more accurate returned shim settings by the learned neural network.

In another implementation of the training method of the invention, by way of a reverse operation machine learning module, region-of-interest data may be returned from the RF-shim settings that were returned in forward operation machine learning. The consistency analysis may be performed on the training dataset by comparing the returned region-of-interest data with the region-of-interest data comprised in the actual load parameters, e.g. as originally input by the user. In this way the training dataset may be enhanced in that data that are unsound or unreliable, such as data associated with hardware defects may be discarded and do not influence the subsequent training of the machine learning module.

In another example of the invention, the magnetic resonance examination system comprises

- a radio frequency (RF) transmit and receive (T/R) system configured to transmit a RF field and to acquire magnetic resonance signals and having an adjustable centre frequency of the RF T/R system's RF resonance frequency bandwidth and
- a trained machine-learning module trained to return the centre frequency setting from imaging circumstances aspects.

An insight of this aspect is that cumbersome-iterations of so-called $F_0$-calibrations of the centre frequency may be replaced by an $F_0$-calibration carried-out on the basis of machine-learning from imaging circumstances aspects. These imaging circumstances aspects may be system induced, such as gradient heating, or characteristics of the cryogen operation of the magnetic resonance examination system's cooling system for its superconducting magnet windings, that represents the magnetic resonance examination system thermal situation. Further, the imaging circumstances aspects may be subject (i.e. patient) induced such ae the load parameters or motion of the subject. Also the imaging circumstances aspects may concern scan type aspects including $B_0$-shim settings as well as $B_1$-shim settings.

In a practical embodiment the centre frequency may be adjusted from an initial centre frequency setting that may have be obtained from measurement in a pre-selected region in the examination zone, or some other way of $F_0$-calibration. The adjustment may be done on the basis of imaging circumstances having changed relative to initial circumstances. For example, owing to patient motion, the measurement zone may need to shifted. The trained machine-learning module may return an update for the measurement zone form the variation of the imaging circumstances, or may even directly return an estimate for the adjusted centre frequency.

In another example of the invention the magnetic resonance examination system comprises a radio frequency (RF) transmit and receive (T/R) system configured to transmit a RF field and to acquire magnetic resonance signals and having an adjustable centre frequency of the RF T/R system's RF resonance frequency bandwidth.

In a more detailed example the trained machine-learning module trained to return the centre frequency setting from one or more actual load parameters.

In a further aspect of the invention, the trained machine learning model is trained to return the centre frequency setting also from a received initial estimate for the centre frequency and thermal aspects of the magnetic resonance examination system's gradient encoding system.

These implementations enable to a large extent to automatically by way of machine learning to accurately set the RF system's centre frequency. This substantially reduces time for preparation phase of the imaging procedure as time for setting the centre frequency is reduced and the adjustment of the centre frequency may be often repeated without much effect on the total scan time of the imaging procedure. It appears that in practice the adjustment of the centre frequency accounts for a significant portion of the preparation time. Thus, the centre frequency may be updated for example between (groups of) signal acquisitions within a clinical examination protocol without a significant increase of total scan time. The ML-based adjustment of the centre frequency may take system induced effects into account such as the thermal behaviour of the magnetic resonance examination system's gradient encoding system. That is, the ML-system is configured to learn the systematic variations of the centre frequency associated with specific scan types. In particular the ML-system may be trained to account for heating associated with a time pattern of previous scans which may be of different types. Also subject induced aspects may be taken into account, such as respiratory motion of the patient to be examined and anatomical variations that affect the actual load in the RF system's transmit and receive antennae. Further, the ML-based centre frequency adjustment may make use of $B_0$-shim settings. These $B_0$-shim settings may be derived by a conventional method or they may be generated by machine-learning as well as disclosed in this description.

The invention further pertains to a computer program as claimed in Claim 18.

Accordingly, when the computer programme of the invention is installed in the magnetic resonance examination system's control processor, the magnetic resonance examination system is enabled to perform the method of the invention. Thus, the computer programme of the invention includes the instructions that cause to bring about the technical effect of the method of the invention. The computer programme of the invention may be provided on a data carrier such as a CD-ROM or a USB-stick. Alternatively, the computer programme of the invention may be downloaded from a data-network such as the world-wide web of cloud-based. The computer programme (product) of the invention comprising instructions which, when the program is executed by a computer, cause the computer to carry out (the steps of) the method of the invention. A computer-readable (storage) medium comprising instructions which, when executed by a computer, cause the computer to carry out (the steps of) the method of the invention.

These and other aspects of the invention will be elucidated with reference to the embodiments described hereinafter and with reference to the accompanying drawing wherein

DETAILED DESCRIPTION OF THE EMBODIMENTS

Figure 1:
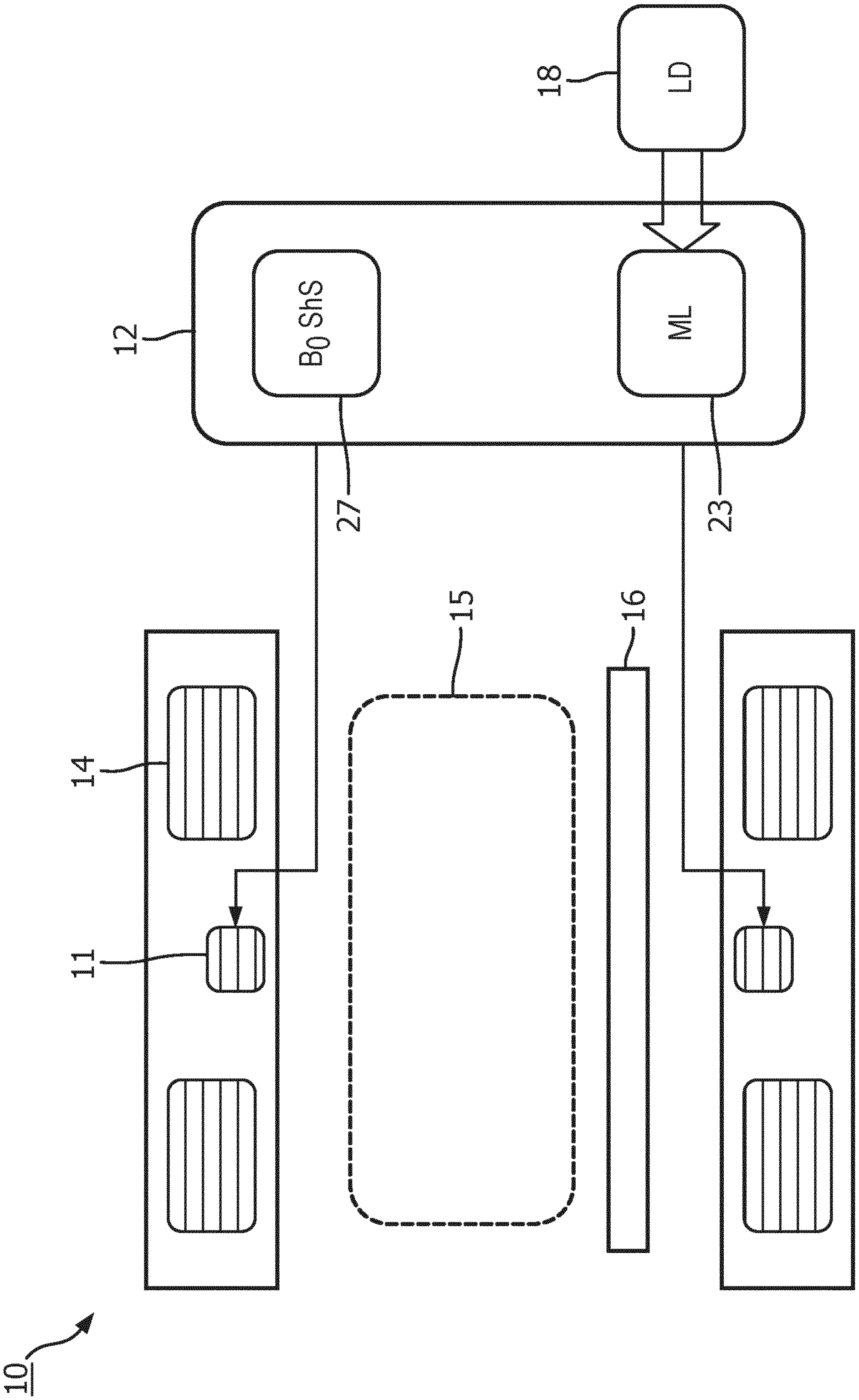
FIG. 1 shows a diagrammatic representation of an example of a magnetic resonance examination system incorporating an implementation of the invention in that the $B_0$-shim settings are returned by machine learning in response to the actual load parameters.

FIG. 1 shows a diagrammatic representation of an example of a magnetic resonance examination system incorporating an implementation of the invention in that the $B_0$-shim settings are returned by machine learning in response to the actual load parameters. The magnetic resonance examination system 10 comprises a magnet system with a set of main field coils 14 that are usually superconducting coils and a set of shim coils 11. The main field coils generate a static magnetic field that is to a large extent spatially uniform. The shim coils 11 can be controlled to generate magnetic correction shim magnetic fields that are superposed on the field of the main magnet so that the superposition field has a higher degree of spatial uniformity at less than 1 ppm. The magnetic resonance examination system comprises a patient carrier 16, usually a moveable patient table on which the patient to be examined may be placed in the magnetic resonance examination system's examination zone 15, in the magnetic field.

The shim coils 11 with the shim driver system 12 form the active shim system. The active shim system is controlled by the shim driver system 12 to activate the active shim system to correct for spatial inhomogeneities of the magnetic field of the main field coils. The shim driver system 12 is provided with a machine learning module 23 including a trained neural network that returns shim settings 27 from actual load data. Good results are obtained with a fully connected network having 250 hidden layers. The shim settings are control signals that regulate the activation of the shim coils. The actual load data represent the way the magnetic field in the examination zone is affected by the body of the patient to be examined. Owing to the patient's body (tissue, blood, bone) magnetic susceptibility the magnetic field in the examination zone is affected by the patient's body. The shim settings activate the shim coils such that the field perturbation caused by the patient to be examined are compensated for.

The machine learning module is trained to generate the shim settings from a set of predetermined parameters that represent the actual (inductive) load due the patient to be examined. These pre-determined parameters include design parameters and siting aspects of the magnet system as well as patient and sequence features. These pre-determined parameters may e.g. relate to e.g. table position, RF coil applied, patient weight, patient orientation, voltage standing wave ratio VSWR of the RF body coil, selected FOV, or selected anatomy. The machine learning model may be trained to generate shim settings initially in parallel with a conventional adjustment of the shim settings. In such a convention approach, the magnetic field distribution may be determined by field mapping that identifies various unwanted harmonic components in the inhomogeneous field. For each unwanted spherical harmonic component in the uncorrected magnetic field, the shim magnetic field is generated by passing an electrical current through the shim coils active shim system. The field mapping may be done one the basis of magnetic field measurements e.g. by way of magnetically sensitive probes distributed over the examination zone. During training of the machine learning model the activation levels of the neural network are adjusted so as to minimise the differences between shim settings returned by the machine learning model and the shim settings produced by the conventional adjustment of the shim settings. Alternatively, the machine learning module may be trained by using a random forest regressor. This is an ensemble learning method for classification, regression and other tasks that operate by constructing a multitude of decision trees at training time and outputting the class that is the mode of the classes (classification) or mean/average prediction (regression) of the individual trees. When the machine learning model has achieved a desired level of accuracy, the conventional adjustment can be dispensed with and the active shim system controlled on the basis of the shim settings returned by the machine learning model only. In this way less time is required to achieve the accurately uniform magnetic field din the examination zone. The training of the machine learning module is done on the basis of shim settings and actual load parameters that match for accurate shimming. These data may be stored locally on board the magnetic resonance examination system. Thus, the machine learning module may be trained in an on-site learning approach involving data sets of pairs of shim settings and actual load parameters that relate to accurate shimming for examinations that are performed most frequently on a the magnetic resonance examination system.

While the distribution of shim settings over a wide variety of examination protocols and individual patients to be examined is often complicated, it appears that the shim settings can be fairly accurately predicted on the basis of the actual load parameters by the trained machine learning module trained on the basis of logfile-data. Pre-trained models for the machine learning module may add to efficiency of the deployment of learning of the machine learning module. These pre-trained models contain initial shim settings for particular parameters representing the patient's body and the examination protocol, including selected values of the imaging parameters of the MR acquisition sequences that represent the level of sensitivity of the MR data acquisition for residual inhomogeneities of the magnet field. For example, these parameters may be input parameters e.g. as mentioned above and e.g. using random forest regressor to predict actually measured values. Standard training procedure using training and validation data may be employed to train the network. This aspect of the invention avoids to have to train the machine learning model from scratch. Further, the machine learning model may be trained also on the basis of data derived from preparatory MR data acquisitions that precede the acquisition of diagnostic MR imaging data and from calibration MR data acquisitions of which information may be employed in the reconstruction of magnetic resonance images form the acquired diagnostic MR imaging data. For example, a main magnetic field map ($B_0$-map) may be obtained from a coil sensitivity map (CSM) in which the local sensitivity profiles of the RF receiver coil (elements) is assessed. These CSM maps are required for unfolding aliasing reconstruction form under-sampled k-space data (parallel imaging, e.g. SENSE). Specifically, a $B_0$-map was simulated from the SENSE reference scan by thresholding the magnitude image and convolution with a dipole kernel to compute the susceptibility induced field distortion. Subsequently the $B_0$-map was expanded into a set of coefficients for orthogonal polynomials (or other suitably chosen basis functions). The coefficients of the lowest orders were used in addition to the logfile values and the predictions of the first model to train a second random forest classifier to obtain the final prediction of shim values. Using other types of images, instead of the SENSE reference scan, may be employed (e.g. coil survey, scout scan) or if available also measured 3D $B_0$-maps.

Instead of using a single model, the model may be decomposed into several more specific sub-models (e.g. depending on scanned anatomy/connected coil). Which model is the right one for the given situation is chosen at run time. This decomposition may be advantageous because some of the log-file parameters are categorical values and some are continuous which raises some scaling issues. These issues can be removed in a natural way by selecting the sub-model based on the categorical values and then only use the continuous values to train the specific sub-model.

Figure 2:
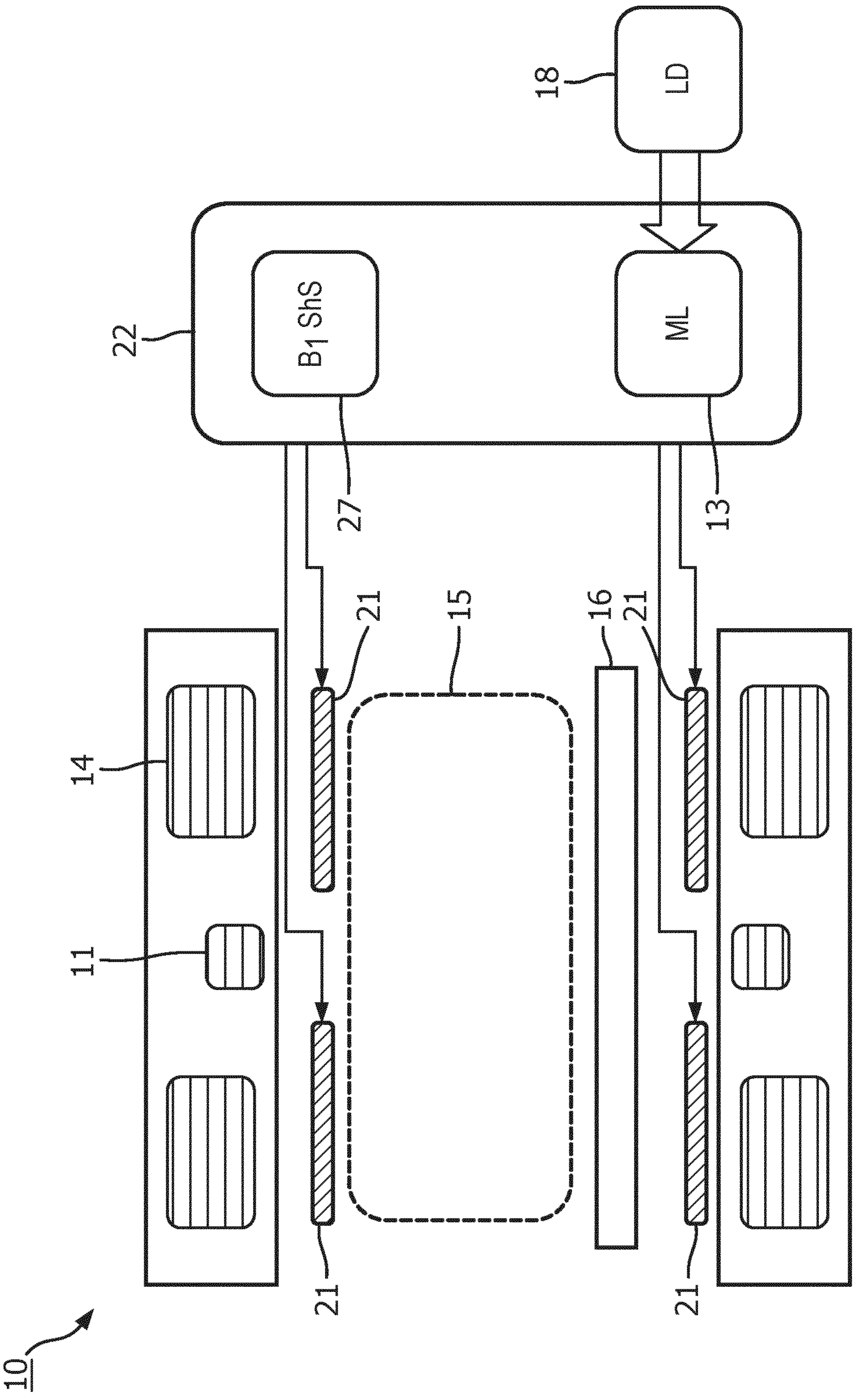
FIG. 2 shows a diagrammatic representation of an example of a magnetic resonance examination system incorporating an implementation of the invention in that the RF-shim settings are returned by machine learning in response to the actual load parameters.

FIG. 2 shows a diagrammatic representation of an example of a magnetic resonance examination system incorporating an implementation of the invention in that the RF-shim settings are returned by machine learning in response to the actual load parameters. In FIG. 2, also RF transmit antenna elements 21 of the RF transmit system are shown. The RF transmit antenna elements can be activated to generate RF ($B_1^+$) field pulses in the examination zone that cause spin manipulations such as excitation, refocusing, inversion of nuclear spins of (e.g. protons or other nuclear dipole moments) in the patient's body. To some extent at least, the RF antenna elements can be activated independently, so that the spatial distribution of the RF field can be controlled, for spatially (non) selective spin manipulations. The RF transmit system includes the RF antenna elements and the RF driver system 22, that includes the RF shim system 25. The RF driver system includes one or more RF amplifiers and regulating circuitry to apply electrical current (pulses) the RF antenna elements. The RF driver system further includes the RF shim system 25 to produce the RF shim settings for the RF antenna elements to correct for deviations from the desired spatial RF field distribution. The RF shim system is equipped with a machine learning model 23 to return RF shim settings for the RF driver from actual load parameters. The machine learning model to return the RF shim settings may be combined with the machine learning model 13 shown in FIG. 1 to generate the main magnetic field shim ($B_0$) shim settings, or two separate machine learning modules may be employed form $B_0$-shimming and RF shimming, respectively. The machine learning module 23 may be trained on the basis of log-file data that contain RF shim settings that are adequate for generating the desired RF field distribution and associated with actual inductive load data. These training data may be generated on the basis of conventional al (e.g. DREAM based) $B_1^+$-mapping procedures for various value of the actual indicative load data that may be parametrised in the same way as for $B_0$-shimming (see above), especially the VSWRs of both body coil channels including their ratio and the table position . . . etc.

Figure 3:
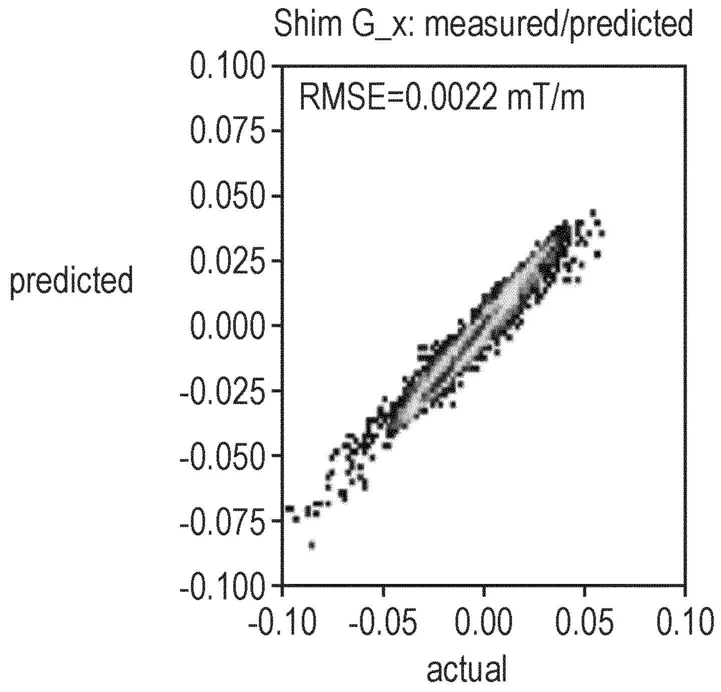
FIGS. 3 and 4 show experimental results of the comparison of measured to machine-learning predicted $B_0$-shim settings and of measured to machine-learned RF-shim settings and FIGS. 5, 6 and 7 show respective schematic representations of different ML-based adjustments of the RF centre frequency.
Figure 4:
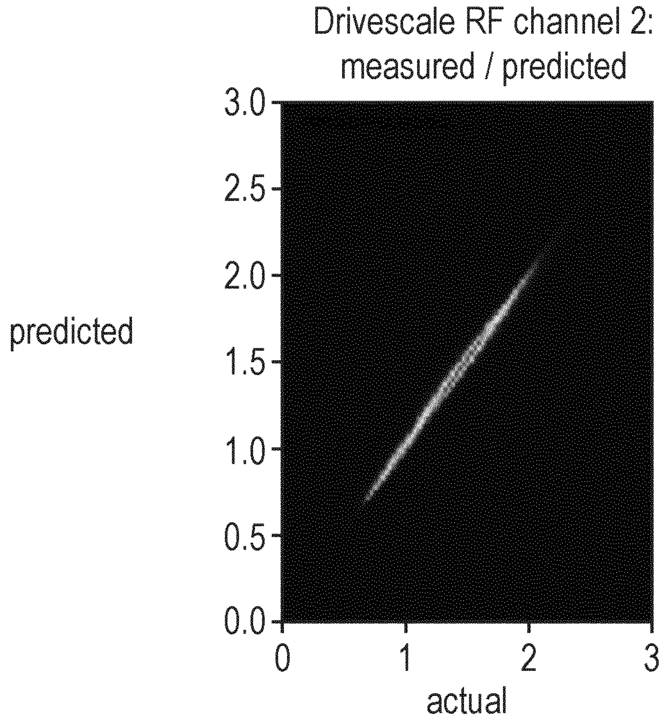

FIGS. 3 and 4 show experimental results of the comparison of measured to machine-learning predicted $B_0$-shim settings and of measured to machine-learned RF-shim settings. The graphs show a fair correspondence between the actual shim settings set by conventional techniques and predicted shim settings returned by the ML-module. This indicates that a reliable estimate is made by the ML-based approach of the invention.

Figure 5:
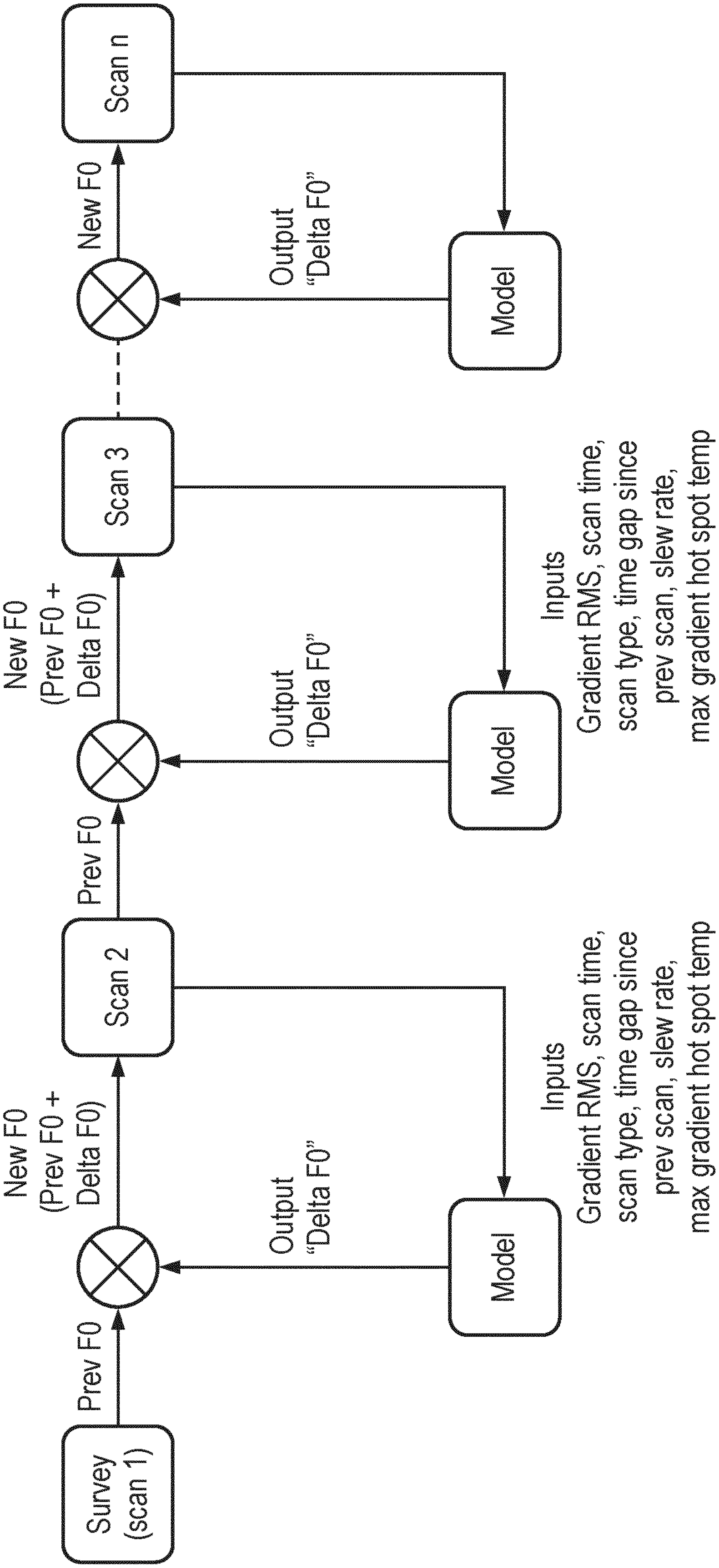
Figure 6:
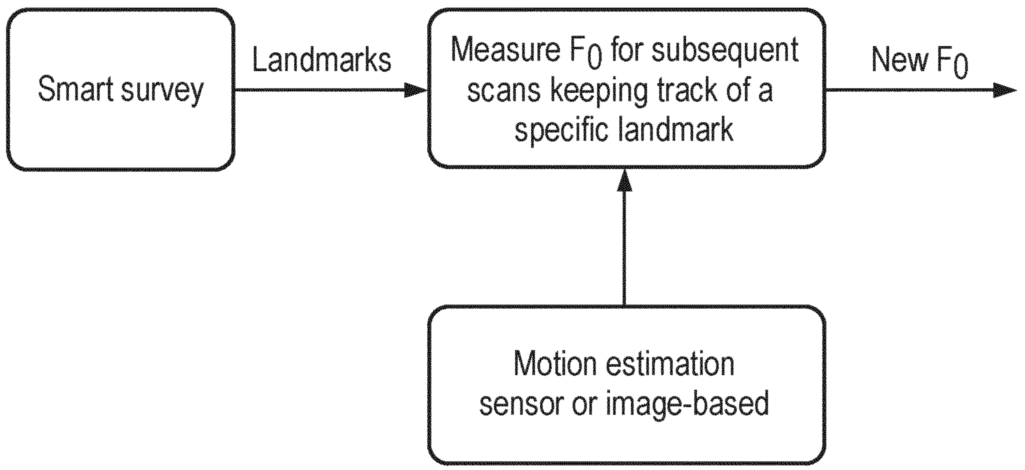
Figure 7:
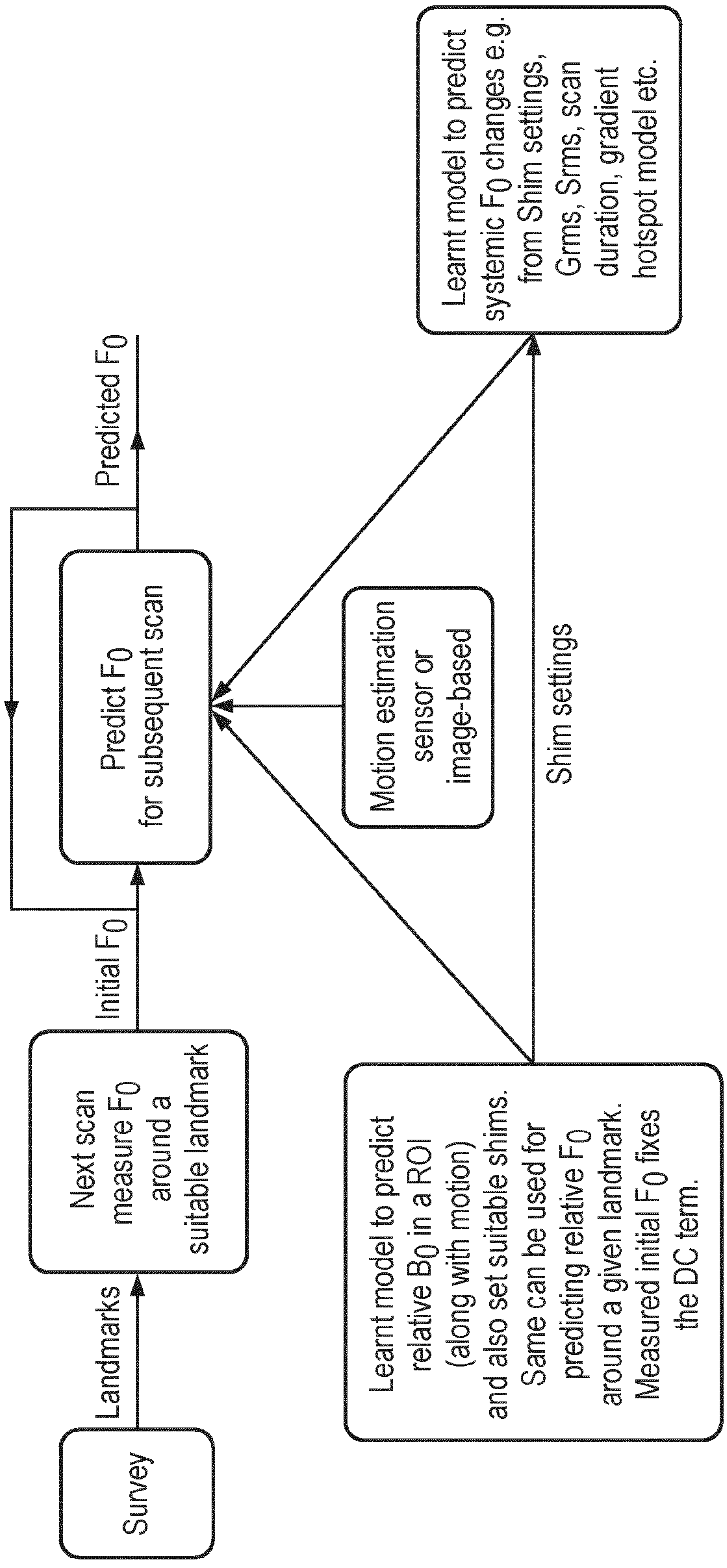

FIGS. 5, 6 and 7 show respective schematic representations of different ML-based adjustments of the RF centre frequency. In particular, in the implementation of FIG. 5 a low resolution 3-plane localiser scan is first scanned to get region of interest imaged in three planes to plan further sessions. Entry points of the preparation phase are run for this scan including centre frequency $F_0$ coarse and fine modes. In this proposed approach, the $F_0$-measured during survey is considered as base value and the change in $F_0$ for the second scan is estimated using the model to predict systematic $F_0$ variations. Similarly, for third scans, $F_0$ obtained from second scan is the base and delta $F_0$ will get computed based on the same model. This step gets repeated for all the subsequent scans of the exam.

While computing the change in $F_0$ from previous scans, parameters like gradient rms value, estimated max gradient hotspot temperature, slew rate, scan time, time between the scans are used as input to the model. The model then predicts the change in $F_0$ which would be added to $F_0$ of previous scan to get the desired $F_0$ for the current scan. In FIG. 6, an implementation of the invention accounts for the fact that the farther the centre of each scan from survey scan, the harder the prediction of $F_0$. Here the proposed solution minimizes the need for multiple $F_0$ measurements during a measurement step by appropriately placing the measurement volume based on the knowledge of anatomical landmarks, keeps track of the patient motion and helps update the $F_0$ more consistently between scans by basing the $F_0$ measurement box around a specific landmark that would have been decided from offline studies. Also, if the subsequent planning changes, but still covers the pre-decided landmark the measured $F_0$ prediction will be effective. However, if a new planning does not cover the specified landmark, a new landmark may have to be identified. In FIG. 7 the implementation of the invention employs the initial estimate of $F_0$ from the survey scan, and also use the anatomical landmarks that can be obtained from survey scan (e.g. from Smart Survey). Further, also the $B_0$-shim prediction is employed in in this embodiment (1-3). At the start of the first scan after survey, a measurement of $F_0$ around a specific landmark near the centre of the planning is made. From learnt knowledge of how relative $B_0$ varies at that particular landmark even with motion (rigid or non-rigid), for all later scans, the $F_0$ is predicted based on the observed motion (either based on sensors or by co-registration of images) and the expected systemic drift. In this case $B_0$-prediction will also be used to set shims. Also, if the subsequent planning changes, but still covers one of the landmarks obtained in the survey, the $F_0$-prediction will still work, as the relative $B_0$ and thus $F_0$ between landmarks will be available from the $B_0$-shim prediction. When the planning does not cover any of the landmarks, a new survey will have to be run covering the region of interest and the initial $F_0$ repeated for continuing the predictions. This implementation completely eliminates the need for $F_0$-measurement.

This implementation has multiple advantages, namely a) Prediction of $B_0$ and setting shims, b) Prediction of F0, and c) Updates both a and b, even in case of motion.

The invention claimed is:

1. A magnetic resonance examination system comprising:
an RF transmit system with RF antenna elements and an RF driver system to activate the RF antenna elements for applying a ($B_1$) radio frequency field having a predetermined spatial distribution;
an RF shim system to control the RF driver system to apply shim radio frequency fields to correct for deviation of the radio frequency field's spatial distribution from the predetermined spatial distribution on the basis of RF-shim settings; and
a trained machine-learning module trained to return the RF-shim settings from one or more actual load parameters,
wherein the radio frequency shim system is configured to perform a validation of the returned RF-shim settings on the basis of an analysis of the actually achieved B1+-RF-field in a preparatory signal acquisition carried out with the returned RF settings.

2. A method comprising:
training a machine-learning module to return the RF-shim settings for an RF driver system to shim radio frequency fields to correct for deviation of the radio frequency field's spatial distribution from the predetermined spatial distribution from one or more actual load parameters, wherein the training is based on log-file information of a magnetic resonance examination system or from an installed base of multiple magnetic resonance examination systems.

3. A magnetic resonance examination system comprising:
an RF transmit system with RF antenna elements and an RF driver system to activate the RF antenna elements for applying a (B1) radio frequency field having a predetermined spatial distribution;
an RF shim system to control the RF driver system to apply shim radio frequency fields to correct for deviation of the radio frequency field's spatial distribution from the predetermined spatial distribution on the basis of RF-shim settings; and
a trained machine-learning module trained to return the RF-shim settings from one or more actual load parameters:
a main magnet configured to apply a uniform static magnetic field;
an active shim system to apply shim magnetic fields to correct for inhomogeneities of the static magnetic field;
a shim driver system to activate the active shim system on the basis of $B_0$-shim settings;
wherein the trained machine-learning module returns the $B_0$-shim settings from one or more actual load parameters, wherein the actual load parameters are determined from images of the examination zone with the patient to be examined in position.

4. A method of training a machine-learning module to return $B_0$-shim settings for an active shim system to apply shim magnetic fields to correct for inhomogeneities of a static magnetic field from one or more actual load parameters that are determined from images of an examination zone with the patient to be examined in position, in which the training is based on log-file information of a magnetic resonance examination system or from an installed base of multiple magnetic resonance examination systems, wherein the log-file information contains information on values of the actual load parameters and optimized shim settings based on imaging procedures carried-out by the magnetic resonance examination system or the installed base, wherein the training of the machine learning module is done on the basis of shim settings and actual load parameters that match for accurate shimming.

5. A magnetic resonance examination system comprising:

a radio frequency (RF) transmit and receive (T/R) system configured to transmit a RF field and to acquire magnetic resonance signals and having an adjustable center frequency of the RF T/R system's RF resonance frequency bandwidth; and a trained machine-learning module trained to return the center frequency setting from imaging circumstances aspects.

6. The magnetic resonance examination system of claim 1, wherein the validation of the return RF-shim settings is completed based on a statistical analysis of the signal levels or the signal levels at a few pre-determined landmark positions acquired in the preparatory signal acquisition.

7. The method of claim 2, wherein a training data set generated from the log-file information is updated according to a validation of the returned RF-shim settings on the basis of an analysis of the actually achieved B1+-RF-field in a preparatory signal acquisition carried out with the returned RF settings.

8. The magnetic resonance examination system of claim 3, further including:

a $B_0$-field mapping system configured to compute $B_0$-shim settings from measurement data representing the spatial distribution of the uniform static magnetic field; and a comparator the compare the computed shim setting values with the values of the $B_0$-shim settings returned from the trained machine learning module.

9. The magnetic resonance examination system of claim 3, wherein the machine-learning module is also trained to return $B_0$-shim settings in response to a low-resolution magnetic resonance image and the shim driver system is configured to generate compound $B_0$-shim settings from (i) the $B_0$-shim settings from the actual load parameter(s) and (ii) the $B_0$-shim settings from the low-resolution magnetic resonance image.

10. The magnetic resonance examination system of claim 3 further comprising a camera configured to acquire the images from the examination zone.

11. The method of claim 4, wherein the training employs at least one from a group consisting of a random forest generator or a neural network.

12. The method of claim 4, wherein a training data set generated from the log-file information is updated according to a validation of returned $B_0$-shim settings on the basis of an analysis of the actually achieved the $B_0$-mapping in a preparatory signal acquisition carried out with the returned the $B_0$-shim settings.

13. The method of claim 4, wherein a reverse operation machine learning module returns region-of-interest data from the returned RF settings; and a consistency analysis is made of the training dataset on the basis of the region-of-interest-data compared with the actual load parameters.

14. The method of claim 4, wherein the consistency analysis log-file data employed for the training are tagged.

15. The magnetic resonance examination system of claim 5, wherein the imaging circumstances aspects include at least any one of:

system induced aspects;

subject induced aspects;

scan type induced aspects; or thermal aspects of the magnetic resonance examination system's gradient encoding system.

16. The magnetic resonance examination system of claim 5, wherein the trained machine-learning module is trained to return the center frequency from a received initial estimate for the center frequency and variations of the imaging circumstances aspect relative to initially estimated imaging circumstances aspects.

17. A computer program comprising executable instructions stored on a non-transitory computer readable medium, which when executed by a processor are configured to perform at least one of the following:

(i) operating a trained machine-learning module trained to return $B_0$-shim settings from one or more actual load parameters that are determined may from images of the examination zone with the patient to be examined in position; and driving a shim driver system to activate an active shim system on the basis of $B_0$-shim settings to cause the active shim system apply shim magnetic fields to correct for inhomogeneities of a static magnetic field; and/or (ii) operating a trained machine-learning module trained to return RF-shim settings from one or more actual load parameters; and driving an RF transmit system with RF antenna elements and an RF driver system to activate the RF antenna elements for applying a (B1) radio frequency field having a predetermined spatial distribution to cause the RF shim system to apply shim radio frequency fields to correct for deviation of the radio frequency field's spatial distribution from the predetermined spatial distribution on the basis of RF-shim settings, and/or (iii) operating a trained machine-learning module to return the centre frequency setting from imaging circumstances aspects; and driving a radio frequency (RF) transmit and receive (T/R) system to transmit a RF field and to acquire magnetic resonance signals causing an adjustable centre frequency of the RF T/R system's RF resonance frequency bandwidth set to the returned centre frequency.

18. The magnetic resonance examination system of claim 8 further including a user-interface configured to derive a confidence map from the comparison of the computed $B_0$-shim settings and the shim settings from the trained machine-learning module and display the confidence map.

* * * * *